(12) United States Patent
Schreiber et al.

(10) Patent No.: US 9,130,079 B2
(45) Date of Patent: Sep. 8, 2015

(54) DETECTOR APPARATUS HAVING A COOLING COMPONENT

(75) Inventors: Frank Schreiber, Dossenheim (DE); Bernd Widzgowski, Dossenheim (DE); Holger Birk, Meckesheim (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 250 days.

(21) Appl. No.: 13/585,991

(22) Filed: Aug. 15, 2012

(65) Prior Publication Data

US 2013/0043377 A1 Feb. 21, 2013

(30) Foreign Application Priority Data

Aug. 16, 2011 (DE) .................. 10 2011 052 738
Feb. 29, 2012 (DE) .................. 10 2012 101 675

(51) Int. Cl.
*H01L 31/024* (2014.01)
*H01J 40/02* (2006.01)
*H01J 40/16* (2006.01)
*H01J 43/02* (2006.01)
*H01J 43/28* (2006.01)

(52) U.S. Cl.
CPC .............. *H01L 31/024* (2013.01); *H01J 40/02* (2013.01); *H01J 40/16* (2013.01); *H01J 43/02* (2013.01); *H01J 43/28* (2013.01)

(58) Field of Classification Search
USPC ............ 250/238, 239, 339.03, 363.04, 458.1, 250/370.15; 356/244; 73/336.5, 335.01, 73/335.06, 31.01–31.05; 62/310, 311, 62/158, 175; 165/222–225, 230, 254
See application file for complete search history.

(56) References Cited

U.S. PATENT DOCUMENTS

| | | | |
|---|---|---|---|
| 3,139,733 A | 7/1964 | Mayer et al. | |
| 4,833,889 A | 5/1989 | Harwell et al. | |
| 4,995,236 A * | 2/1991 | Rouquier et al. | 62/51.1 |
| 5,311,044 A * | 5/1994 | Iwanczyk et al. | 257/186 |
| 5,508,740 A | 4/1996 | Miyaguchi et al. | |
| 5,596,228 A | 1/1997 | Anderton et al. | |
| 6,133,569 A * | 10/2000 | Shoda et al. | 250/332 |
| 7,265,340 B2 | 9/2007 | Minamio et al. | |
| 8,253,093 B2 | 8/2012 | Liedtke et al. | |
| 2004/0135071 A1 | 7/2004 | Negi et al. | |
| 2004/0238741 A1 * | 12/2004 | Gat et al. | 250/338.1 |

FOREIGN PATENT DOCUMENTS

| | | |
|---|---|---|
| DE | 102009036066 A1 | 2/2011 |
| EP | 1541979 A1 | 6/2005 |
| JP | 11329338 A | 11/1999 |

* cited by examiner

*Primary Examiner* — Francis M Legasse, Jr.
(74) *Attorney, Agent, or Firm* — Leydig, Voit & Mayer, Ltd.

(57) ABSTRACT

A detector apparatus is configured to receive light and generate electrical signals. The detector apparatus includes a light sensor having a light incidence side and a cooling component. The cooling component is in direct contact with at least one of the light sensor, on the light incidence side, or a substrate carrying the light sensor.

24 Claims, 6 Drawing Sheets

DETECTOR APPARATUS HAVING A COOLING COMPONENT

CROSS REFERENCE TO RELATED APPLICATIONS

This application claims priority to German Patent Application Numbers. DE 10 2011 052 738.9, filed Aug. 16, 2011, and DE 10 2012 101 675.5, filed Feb. 29, 2012, which are hereby incorporated by reference herein in their entirety.

FIELD

The present invention relates to a detector apparatus which is embodied to receive light and to generate electrical signals, having a light sensor that comprises a light incidence side, and having a cooling component.

BACKGROUND

Detector apparatuses of the kind recited above often have a temperature-dependent dark current that causes noise. This dark current can be decreased by cooling.

DE 10 2009 036 066 A1 describes an optoelectronic detector that comprises a cooling apparatus, specifically a Peltier element, connected thermally conductively to the detector. To avoid the occurrence of condensation on a surface of the optoelectronic detector, a sensor is provided for ascertaining an instantaneous value with regard to the ambient relative humidity and the ambient dew point temperature. The sensor is connected to a control unit that controls the cooling apparatus as a function of the value. This optoelectronic detector has the advantage that cooling is not entirely dispensed with. It has the disadvantage, however, that the actual cooling output is limited to a small magnitude, namely to the magnitude at which no condensation occurs. The ultimate result of this is that detector noise is only insufficiently eliminated.

The same document mentions another detector apparatus in which the detector plus the cooling apparatus, typically a Peltier element, are encapsulated in an airtight housing that is filled with a dry gas or is evacuated. With this apparatus, the waste heat of the cooling apparatus can be delivered to a cooling element that is connected thermally conductively to the cooling apparatus, and/or can be used to heat other components, for example an entry window of the housing. This detector apparatus is, however, identified as disadvantageous because the airtight encapsulation is complex.

It has in fact been found in practice that this detector apparatus has even further disadvantages. In particular, cooling is often not very effective. In addition, cooling proves to be particularly difficult when the detector must be at a different electrical potential level than the housing. In this case the Peltier element cannot simply be arranged between the housing and detector. A potential difference of this kind is usually necessary when acceleration of photoelectrons is intended to occur inside the detector.

Detector apparatuses in which an active cooling apparatus is respectively provided on a side facing away from a light incidence side of a light sensor are described, for example, from U.S. Pat. No. 5,508,740, U.S. Pat. No. 5,596,228, or U.S. Pat. No. 4,833,889. These detector apparatuses have the disadvantage that much of the cooling output is unused and lost.

SUMMARY

In an embodiment, the present invention provides a detector apparatus configured to receive light and generate electrical signals that includes a light sensor having a light incidence side and a cooling component. The cooling component is in direct contact with at least one of the light sensor, on the light incidence side, or a substrate carrying the light sensor.

BRIEF DESCRIPTION OF THE DRAWINGS

Exemplary embodiments of the present invention are described in more detail below with reference to the drawings. All features described and/or graphically depicted, of themselves or in any useful combination, constitute the subject matter of the present invention, regardless of their combination in the claims or their internal references.

In the drawings.

DETAILED DESCRIPTION

Figure 1:
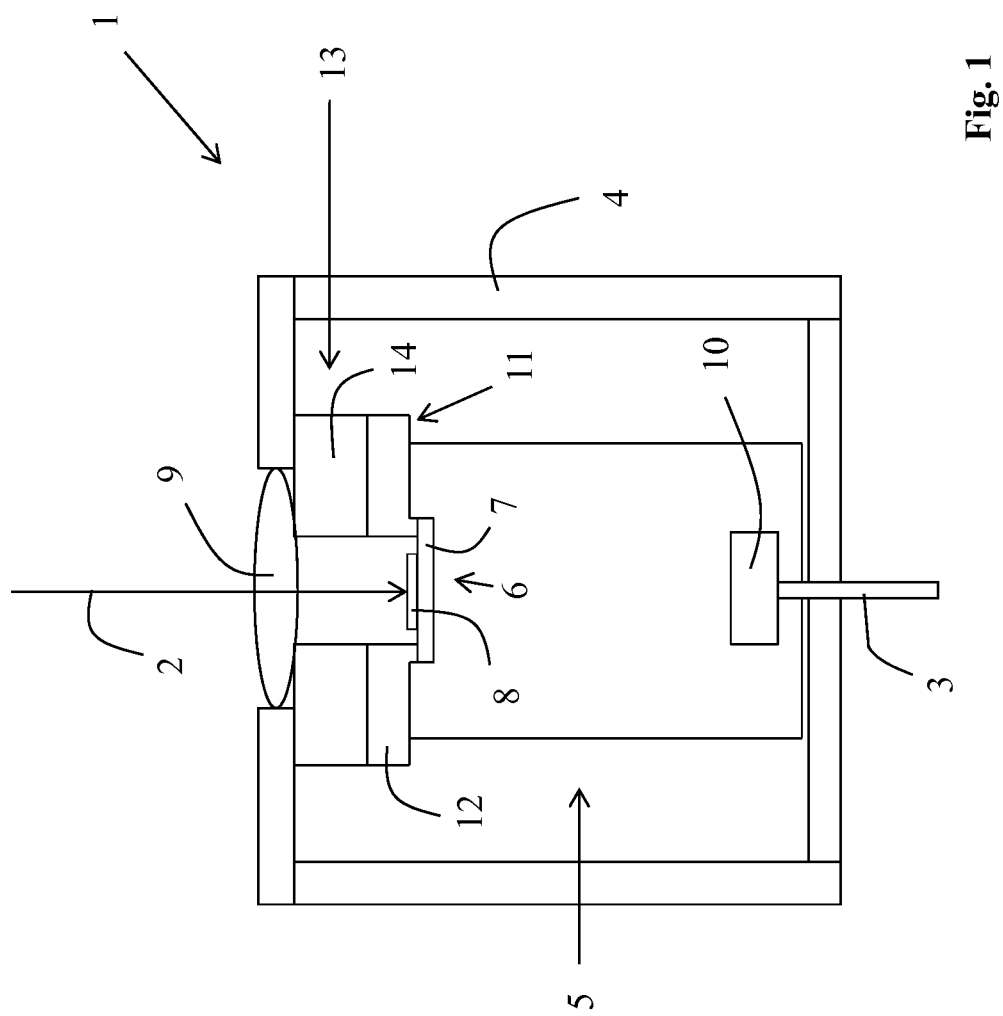
FIG. 1 schematically shows an exemplifying embodiment of a detector apparatus according to the present invention, FIG. 2 schematically shows an exemplifying embodiment of another detector apparatus according to the present invention, FIG. 3 schematically shows an exemplifying embodiment of yet another detector apparatus according to the present invention, FIG. 4 schematically shows an exemplifying embodiment of another detector apparatus according to the present invention.

In an embodiment, the present invention provides a detector apparatus that makes possible more efficient cooling, in particular including when detectors that are at an electrical potential level different from the housing are used.

In an embodiment, the present invention provides a detector apparatus in which the cooling component is in direct contact, on the light incidence side of the light sensor, with the light sensor and/or with a substrate carrying the light sensor.

Especially for an embodiment in which the light sensor and/or a detector comprising the light sensor are operated at a hazardous voltage, but also in order to protect the light sensor and/or the downstream electronics, provision can advantageously be made that the detector apparatus comprises a housing, and/or that the light sensor and the cooling component are arranged in a housing.

In a very particularly advantageous embodiment, a further cooling component is provided, in particular inside a housing. In particular, a further cooling component that is in thermally conductive contact with the cooling component can advantageously be provided.

Particularly effective cooling can advantageously be achieved by the fact that a light path, which passes through the cooling component and/or the further cooling component, is defined for the light to be detected. Provision can be made, in particular, that the cooling component and/or the further cooling component surrounds, for example in circular form, the sensor surface reachable by the light to be detected.

Provision can be made, for example, that the cooling component and/or the further cooling component comprises a passage, in particular a passthrough hole, through which the light to be detected travels to the sensor. Provision can be made here in particular that the aperture is embodied conically and/or with oblique walls, in order to enable even light that is incident obliquely to the surface of the light sensor to travel without impediment through the cooling component and/or the further cooling component to the light sensor.

Provision can also be made, however, that the cooling component and/or the further cooling component are constructed in two-part or multi-part fashion, the parts being arranged with respect to one another in such a way that an interstice remains through which the light path for the light to be detected extends.

The further cooling component as well can advantageously be embodied as a thermally conductive, electrically insulating intermediate element. In particular, as will be further described in detail below, the further cooling component can be embodied as a passive cooling component, in particular as a heat-dissipating ring, that is arranged between the detector and an active cooling component, for example a Peltier element.

In a particular embodiment, the cooling component is embodied as a thermally conductive, electrically insulating intermediate element. Such an embodiment has the particular advantage that heat can be conducted away from the light sensor even when the latter is at a different voltage level, for example with respect to a surrounding housing, in particular at a voltage level of over 1000 V, in particular over 2000 V, in particular over 4000 V, in particular of approx. 8000 V. A thermally conductive, electrically insulating intermediate element of this kind can be embodied in particular, for example, as a passive cooling component through which thermal conduction takes place.

In an advantageous embodiment, the further cooling component as well can be arranged in such a way that it is in direct contact with a light sensor of the detector, for example a photocathode. Provision can also be made, alternatively or additionally, that the further cooling component is in direct contact with a substrate that carries a light sensor, for example a photocathode.

Particularly effective cooling is achieved by means of the direct contact of the cooling component and/or the further cooling component with a light sensor of the detector and/or with a substrate that carries a light sensor. Such an embodiment has, in particular, the advantage that only the components that actually exhibit temperature-dependent noise behavior are cooled.

In addition, advantageously, a substantially lower cooling output is required with such an embodiment; this is particularly advantageous when the cooling component and/or the further cooling component is embodied as an active cooling component, for example as a Peltier element. For the case in which the cooling component and/or the further cooling component is embodied as an active cooling component, the advantageous result is that less waste heat that has to be transported outward also occurs.

In a particular embodiment, provision is made that the light sensor and the housing are thermally conductively connected by means of the cooling component and/or the further cooling component, the contact area of the cooling component and/or of the further cooling component with the light sensor being smaller than the contact area of the cooling component and/or of the further cooling component with the housing. Such an embodiment has the very particular advantage that on the one hand, particularly good heat transport away from the light sensor is guaranteed, while on the other hand free access to the light-sensitive surface of the light sensor for the light to be detected is at most slightly limited.

As already mentioned, the cooling component and/or further cooling component can advantageously be embodied as an active cooling component, in particular as a Peltier element or as a heat pump or as a heat pipe. In a very particularly advantageous embodiment, the cooling component is embodied as an annular Peltier element. Such an embodiment offers the advantage that the light path for the light to be detected can extend through the center of the ring, so that upon passing through the annular Peltier element, the light path is arranged substantially coaxially with the rotational axis of symmetry of the annular Peltier element.

In a very particularly advantageous embodiment, the cooling component and/or the further cooling component are arranged in such a way that the waste heat of the cooling component and/or of the further cooling component heats at least an entry window of the housing and/or an entry optic of the housing. Such an embodiment has the very particular advantage that no condensation settles on the surfaces of the entry window or on the surfaces of the entry optic, for example a lens or an arrangement of multiple lenses. This is ensured in particular when, utilizing the waste heat, the temperature of the surfaces of the entry window or of the optic is held above the dew point.

In particularly advantageous fashion, provision can be made that the cooling component and/or the further cooling component is embodied as a passive cooling component through which a heat flow takes place. It is particularly advantageous if the passive cooling component and/or the further passive cooling component exhibits good thermal conductivity, in order to guarantee rapid heat transport. Provision can advantageously be made, in this regard, that the cooling component and/or the further cooling component exhibits a thermal conductivity greater than 1 W/mK, in particular greater than 10 W/mK, in particular greater than 100 W/mK, very particularly greater than 500 W/mK.

In a very particularly advantageous embodiment, the passive cooling component and/or the further passive cooling component is shaped and dimensioned such that it can conform in accurately fitting fashion, and over the largest possible area, against that component of the detector apparatus which is to be cooled, in particular against a light sensor and/or against a light-sensor-carrying substrate. Particularly good cooling is thereby achievable. The same also applies analogously to the instance in which the cooling component is embodied as an active cooling component and/or the further cooling component is embodied as an active further cooling component. The configuration of the cooling component or of the further cooling component is, however, always effected in such a way that the functioning of the detector, and/or the functioning of parts of the detector, is not disadvantageously impaired, for example due to shadowing of a light path.

In a very particularly advantageous embodiment that is usable in particular when the detector and/or parts of the detector are at a different electrical potential level than the housing, the cooling component and/or the further cooling component is embodied in electrically largely insulating fashion. Provision can be made in particular that the cooling component and/or the further cooling component has an electrical conductivity of less than 10–7 S/m, in particular less than 10–8 S/m.

Such an embodiment has the very particular advantage that the detector can be in mechanical contact with the housing via the cooling component or the further cooling component, while the detector is nevertheless electrically insulated at least to the extent that it can be operated at the necessary potential level. For example, provision can be made that the detector comprises an acceleration apparatus for accelerating electrons generated by means of a photocathode, in which context the accelerated electrons can be directed, for example, to an avalanche diode. Provision can also be made, alternatively, that the detector contains a secondary electron multiplier. It may happen in that regard that an electrical voltage difference of several thousand volts must be applied between the detector or parts of the detector, and the housing.

In particular in order to allow such voltage differences to be withstood, provision is made in a particular embodiment of the detector that the cooling component and/or the further cooling component is made at least partly of an electrically insulating and thermally conductive material, in particular of boron nitride, aluminum nitride, aluminum oxide, diamond, synthetic diamond, or a combination of said materials. These substances are notable on the one hand for high thermal conductivity, and on the other hand for very low electrical conductivity. In addition, these materials offer the advantage that they can be easily and accurately machined, for example by grinding, turning, or milling.

As already explained, provision can advantageously be made that the cooling component and/or the further cooling component is both an electrical insulator and a thermal conductor. Especially in order to achieve this, the cooling component and/or the further cooling component can be made at least partly of a composite material. For example, the cooling component and/or the further cooling component can respectively comprise a core made of a thermally conductive material, for example a metal such as, for example, aluminum or copper, that is surrounded at least partly by an electrical insulator. Provision can be made in particular that the surrounding electrical insulator is thinner, with reference to the thermal conduction direction, than the core. The core can, in particular, have a thickness of several millimeters or even several centimeters.

In particular because of the easy machinability of a, for example, metal core, the cooling component and/or the further cooling component can be manufactured without great complexity as a composite component even in unusual shapes.

On the one hand, the core functions as a spacer, for example between the light sensor and a housing or for example between the light sensor and a cooling component and/or further cooling component embodied in particular as a Peltier element. The good thermal conductivity property of the block is furthermore utilized. In order to bring about electrical insulation, the block is surrounded by an electrical insulator. In a particular embodiment, the electrical insulator is embodied as an insulator film, in particular as a plastic film. The use of a kapton film, for example, is appropriate. Because a suitable plastic film, for example a kapton film, can already exhibit a very high dielectric strength even at a thickness of fractions of a millimeter, the electrical insulator film can be made substantially thinner than the core. The result thereby achieved is, in particular, that the electrical insulator film has almost no thermal insulation effect. The particular combination of the thermally conductive core with the thinner electrical insulation foil results in a cooling component and/or further cooling component that is both electrically insulating and thermally conductive.

The surrounding electrical insulator can also be made of an initially liquid material that is applied onto the core, for example by brushing, spraying, or immersion, and cures thereon.

In particular for embodiments in which large potential differences exist—in accordance with an independent inventive idea that is also implementable separately from any specific arrangement of the cooling component and/or of the further cooling component—provision can advantageously be made that the cooling component and/or the further cooling component comprises, in order to increase leakage current resistance on an outer surface, a leakage path that is lengthened by means of a labyrinth and/or by means of ribs and/or by means of at least one groove and/or by means of at least one projection.

In a very particular embodiment, provision is made that the cooling component and/or the further cooling component comprises, in particular to increase the leakage current resistance, at least one circumferential projection or at least one circumferential groove. Such an embodiment has the particular advantage that the leakage path along the surface of the cooling component or of the further cooling component is lengthened, so that the risk of an electric flashover is at least decreased.

In particular for embodiments in which large potential differences exist—in accordance with an independent inventive idea that is also implementable separately from any specific arrangement of the cooling component and/or of the further cooling component—provision can be made, advantageously, that interstices of the cooling component and/or of the further cooling component are filled with an electrically insulating material. In particular when a thermoelectric converter is used, in particular a Peltier element, provision can additionally advantageously be made that the filler material is embodied to be both electrically and thermally insulating. In a particular embodiment, the cooling component and/or the further cooling component are embodied as a thermoelectric converter, in particular as a Peltier element, whose interstices are filled, in particular encapsulated, with epoxy resin or silicone.

Undesired voltage flashovers can be effectively avoided by filling the interstices of the cooling component and/or of the further cooling component with an electrically insulating material. Filling with electrically insulating material effectively suppresses flashing over of sparks along the surface of internal components such as, for example, the usually columnar semiconductor elements of a Peltier element.

Advantageously, the cooling component and/or the further cooling component can be embodied substantially annularly or cylindrically. As already mentioned, this offers both particular advantages in terms of bringing the cooling component or the further cooling component into contact, for example, with a light sensor or a light-sensor-carrying substrate in a manner favorable for effective cooling, and on the other hand the further advantage that an aperture exists for the light path of the light to be detected.

In an embodiment that works particularly effectively and reliably, the cooling component and the further cooling component are arranged thermally in series. In particular, provision can be made especially advantageously that the cooling component is embodied as a passive cooling component, for example as a boron nitride ring, and is in direct contact with a light sensor and/or with a light-sensor-carrying substrate.

In addition, provision can advantageously be made that said cooling component is in thermal contact with a further cooling component that is embodied as an active cooling component, for example as an annular Peltier element.

The annular cooling component and the annular further cooling component are preferably arranged coaxially with one another, the light path for the light to be detected extending along the rotational axis of symmetry of the cooling component and of the further cooling component. In addition, provision can advantageously be made that the further active cooling component, for example the hot side of a Peltier element, is in contact with an entry window or an entry optic of the housing. Such an arrangement is notable for the fact that a light sensor of the detector can be cooled particularly effectively, since direct heat transport occurs from the light sensor or its substrate through the passive cooling component to the active cooling component. In addition, the waste heat of the active cooling component is advantageously used to prevent the occurrence of condensation on the entry window or entry optic. If an electrically largely insulating material, for example boron nitride, is used as a cooling component in this arrangement, this then makes it possible, very advantageously, to operate the detector at a potential level that differs from the potential level of the housing.

In particular in order to avoid the occurrence of condensation, provision can advantageously be made that the housing is gas-tight and/or that a vacuum exists in the housing. For example, provision can also be made that the gas-tight housing is filled with a gas, preferably a dry gas, whose dew point is particularly low. It can be advantageous, for example, to introduce a drying agent into the housing. This serves to remove any residual moisture that may still be present, or to absorb moisture that penetrates in.

In an embodiment that cools particularly efficiently, the cooling component is a passive cooling component that conducts heat from the light sensor and/or from the substrate of the light sensor to a further active cooling component, in particular to a Peltier element, that is not in direct contact with the light sensor nor with a substrate of the light sensor. Provision is additionally made that the further active cooling component emits heat to the housing. The result of the particular sequence of the arrangement is that the additional process heat of the active cooling component does not need to be conducted through the passive cooling component.

Very particularly preferably, the detector apparatus according to the present invention can be used with or in a microscope, in particular a scanning microscope or a confocal scanning microscope. In a very particularly advantageous embodiment of a confocal scanning microscope, the latter comprises several of the detector apparatuses according to the present invention. For example, provision can be made that different detection spectral regions are allocated and/or can be allocated to the individual detector apparatuses.

FIG. 1 shows a detector apparatus 1 which is embodied to receive light 2 and to make available electrical signals at an electrical output 3. Detector apparatus 1 comprises a housing 4 in which a detector 5 is arranged.

Detector 5 comprises a light sensor 6, namely a photocathode 8 arranged on a substrate 7, that is operated in a transmission arrangement. This means that photocathode 8 receives, on its side facing toward an entry optic 9 of housing 4, light 2 to be detected, and on the side facing away from it emits photoelectrons.

Photocathode 8 and its substrate 7 are at a potential level of −8000 V, while housing 4 is at a potential level of 0 V.

Detector 5 furthermore comprises an avalanche diode 10 that is at a potential level of −400 V. The photoelectrons generated by photocathode 8 are accelerated because of the potential difference existing between photocathode 8 and avalanche diode 10, and strike an avalanche diode 10 that outputs electrical signals via electrical output 3.

Detector apparatus 1 comprises, within housing 4, a cooling component 11 that is embodied as a passive cooling component. Concretely, cooling component 11 is embodied as a thermally conductive, electrically insulating intermediate element 12. Intermediate element 12 has an annular shape, the center axis of the intermediate element extending coaxially with the light path of light 2 to be detected.

Detector apparatus 1 furthermore comprises, within housing 4, a further cooling component 13 that is embodied as an annular Peltier element 14. The annular Peltier element 14 is arranged coaxially with the annular intermediate element 12.

The annular Peltier element 14 is in thermally conductive contact with intermediate element 12. Intermediate element 12 is in thermally conductive contact with substrate 7.

By way of the thermally conductive, electrically insulating intermediate element 12, the cooling output can be utilized particularly effectively to cool substrate 7 and photocathode 8. Provision is furthermore made that the warm side of the annular Peltier element 14 faces toward housing 4 and toward entry optic 9. The result is that entry optic 9 is heated again so that water cannot condense. The remainder of the interstice between detector 5, intermediate element 12, and the annular Peltier element 14 with respect to housing 4 is filled with a thermally and electrically insulating potting compound. The region between entry optic 9 and photocathode 8 is filled with a dry gas.

Figure 2:
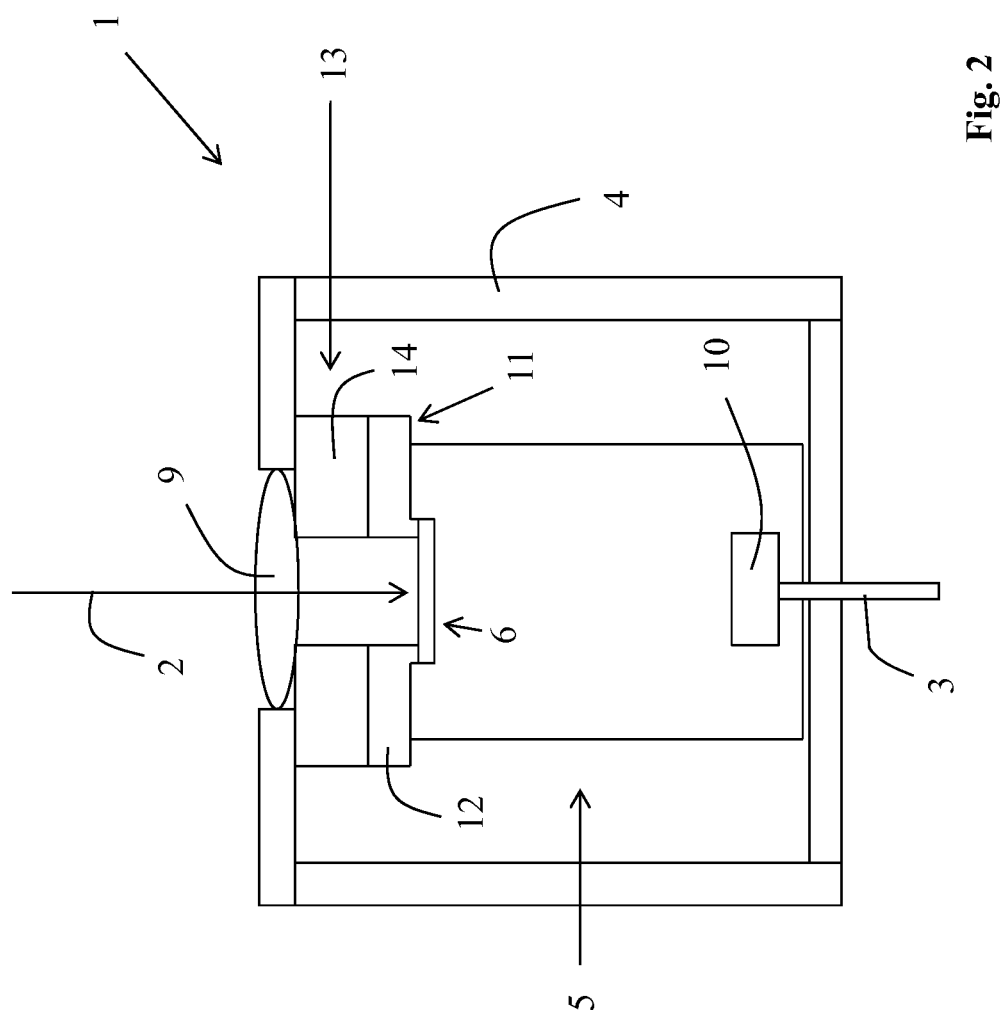

FIG. 2 shows another detector apparatus in which intermediate element 12 is in direct thermally conductive contact with light sensor 6.

Figure 3:
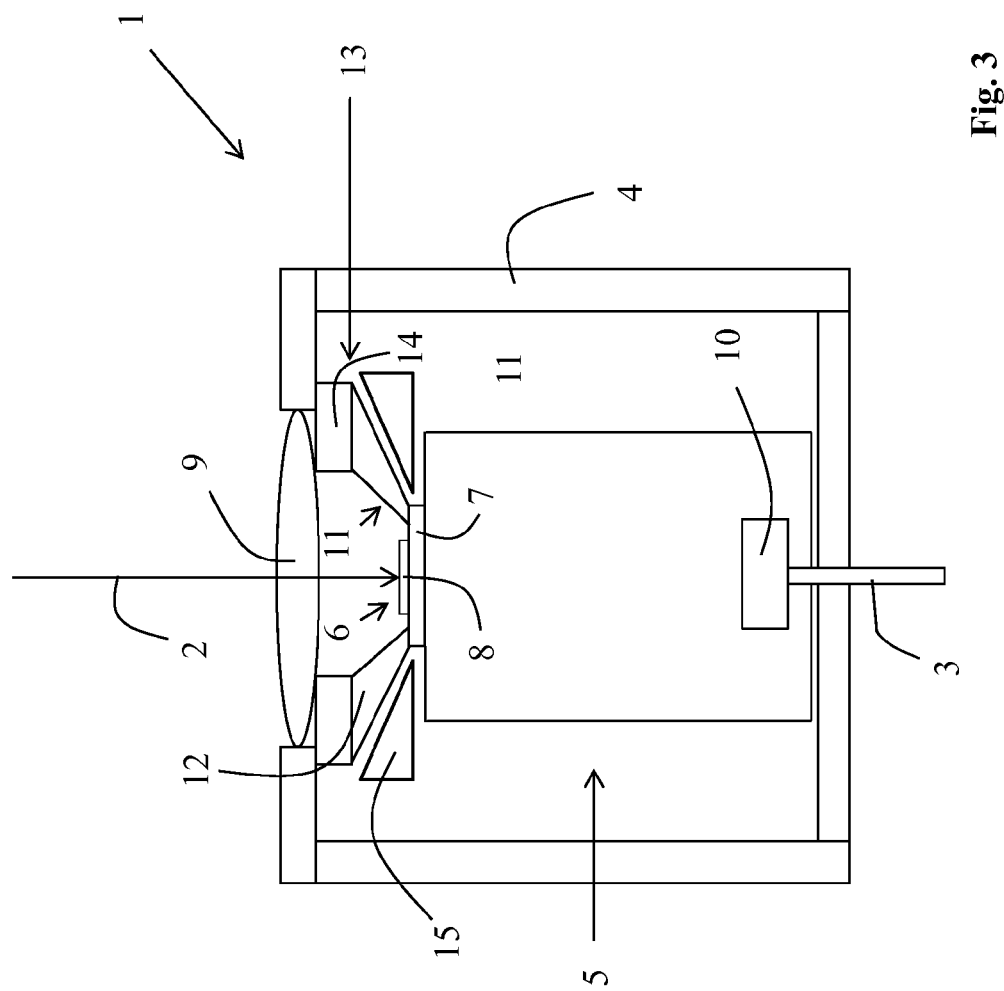

FIG. 3 schematically shows an exemplifying embodiment of another detector apparatus according to the present invention that corresponds substantially, in terms of basic construction, to the detector apparatuses shown in FIGS. 1 and 2. Cooling component 11, however, which is embodied as a thermally conductive, electrically insulated intermediate element 12, comprises a conical passage for light 2 to be detected. In addition, further cooling component 13 is equipped with a passage of enlarged diameter (as compared with the embodiments shown in FIGS. 1 and 2). An enlarged entry window of housing 4 is furthermore installed. This embodiment has the particular advantage that the numerical aperture is substantially increased. The result is that even obliquely incident light can travel without impediment to the light sensor embodied as photocathode 8.

In particular, the entry window is embodied to be substantially larger than the light sensor, in this example photocathode 8. The radius of the inside opening of cooling component 11 and of further cooling component 13 therefore increases from photocathode 8 out toward the entry window. An additional result of this is that the contact area between cooling component 11 embodied as intermediate element 12, and further cooling component 13, namely Peltier element 14, is substantially increased, which in particular ensures good heat dissipation.

In the embodiment depicted in FIG. 3, the contact area of cooling component 11 with substrate 7 of light sensor 6 is also larger than the contact area of cooling component 11 with further cooling component 13, although cooling component 11 is not directly in contact with further components of detector 5. For this purpose in particular, the outer contour of cooling component 11 is also embodied conically.

An annular thermal insulator that surrounds cooling component 11 is provided in order to bring about additional thermal insulation relative to the housing.

Figure 4:
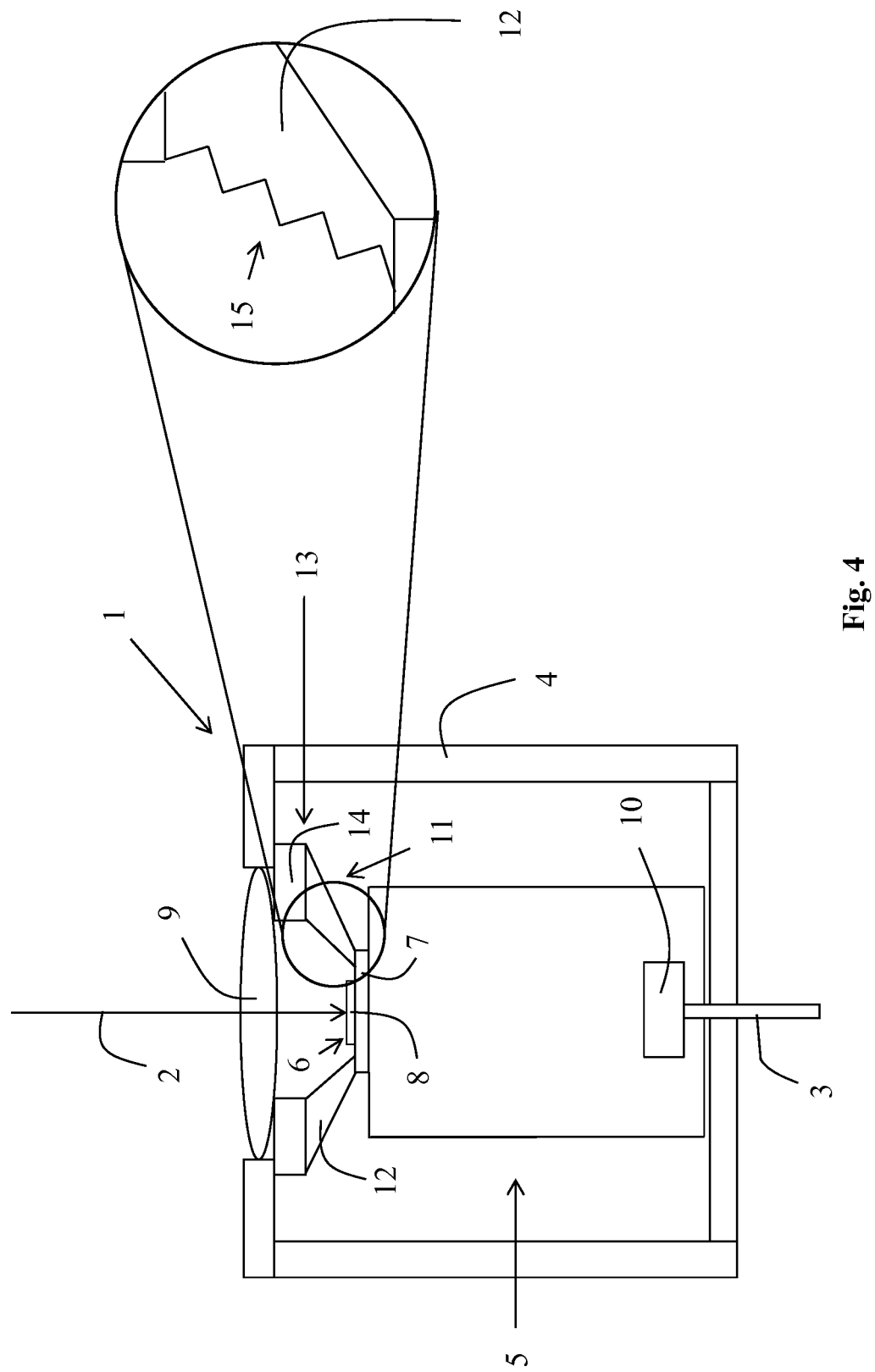

FIG. 4 schematically shows an exemplifying embodiment of another detector apparatus according to the present invention that substantially corresponds in construction to the embodiment shown in FIG. 3. In order to increase leakage current resistance, the passage of intermediate element 12 for light 2 is equipped with circumferential ribs 15. This lengthens the leakage path from light sensor 6 to further cooling component 13, and thereby substantially decreases the risk of an electrical flashover.

Figure 5:
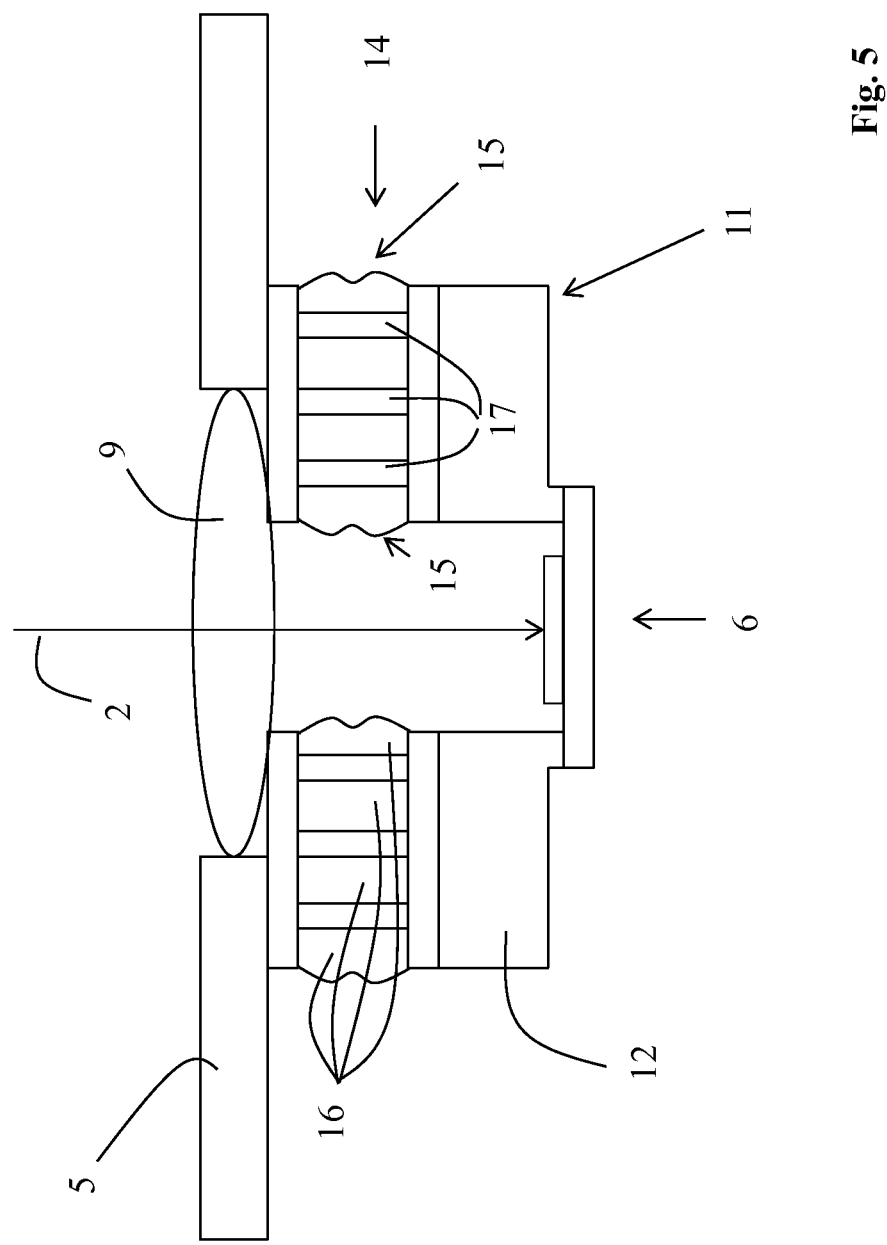
FIG. 5 is a depiction in detail of a further exemplifying embodiment of a detector apparatus according to the present invention.

FIG. 5 is a depiction in detail of a further exemplifying embodiment of a detector apparatus according to the present invention.

In this embodiment, the interstices of further cooling component 13, namely of Peltier element 14, are filled with an electrically insulating material 16, for example with silicone. Filling the interstices with an electrically insulating material 16 allows undesired voltage flashovers to be effectively avoided. Filling with an electrically insulating material 16 effectively suppresses the flashover of sparks along the surface of interior components, such as the columnar semiconductor elements 17 of Peltier element 14.

In addition, the electrically insulating material 16 on the outer side, and in the region of the passage for light 2, is equipped with ribs 15 in order to lengthen the leakage path.

Figure 6:
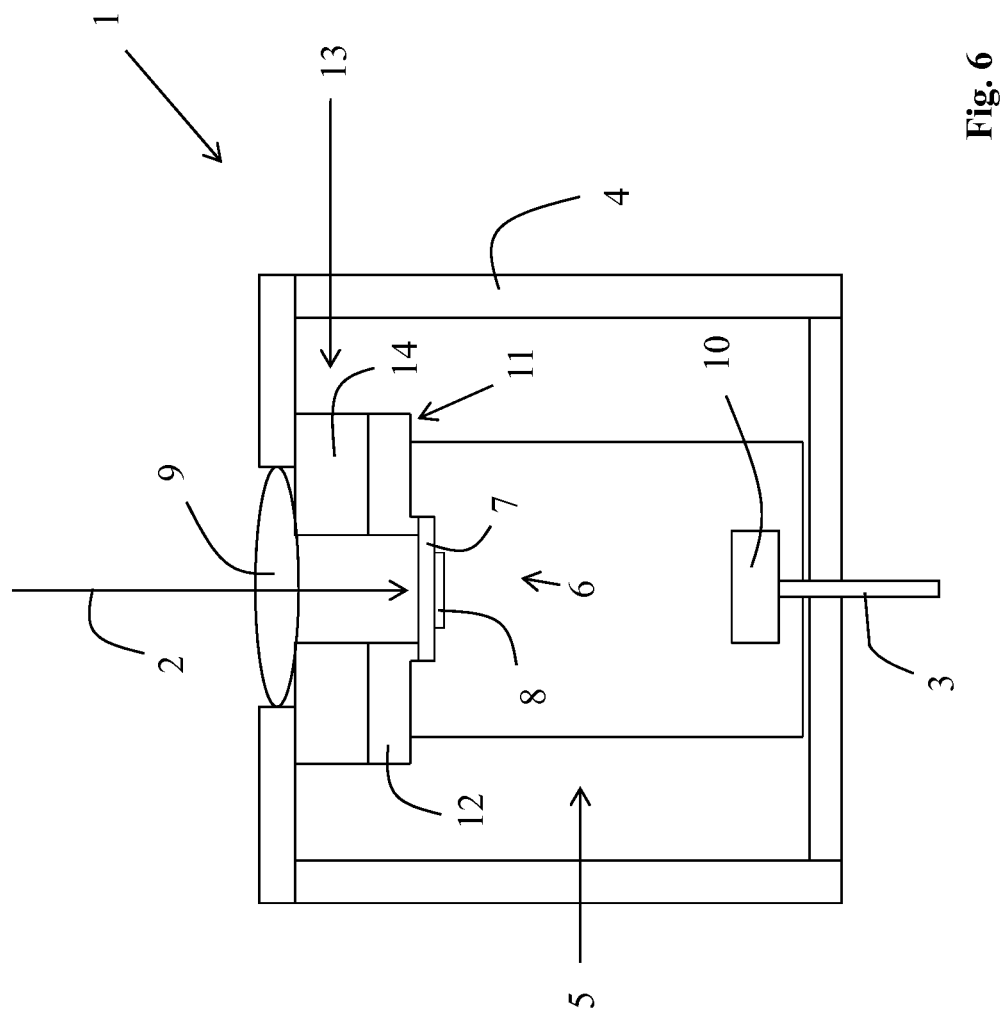
FIG. 6 is a depiction in detail of a further exemplifying embodiment of a detector apparatus according to the present invention.

FIG. 6 is a depiction in detail of a sixth exemplifying embodiment of a detector apparatus according to the present invention. This embodiment the light sensor 6 differs from the light sensor 6 shown in FIG. 1.

The light sensor 6 has a photocathode 8 supported by a substrate 7, which is translucent for the light 2 to be detected. The light 2 to be detected passes the substrate 7 before it reaches the photocathode 8. The photocathode 8 is arranged in a housing of the detector 5. In the housing of the detector 5 exists a vacuum, whereby the opening of the housing of the detector 5 is sealed by the substrate 7. This embodiment has the advantage that it is not necessary (but possible) to put the housing 4 under vacuum as well.

While the invention has been particularly shown and described with reference to preferred embodiments thereof, it will be understood by those skilled in the art that various changes in form and details may be made therein without departing from the spirit and scope of the invention.

PARTS LIST

1 Detector apparatus
2 Light to be detected
3 Electrical output
4 Housing
5 Detector
6 Light sensor
7 Substrate
8 Photocathode
9 Entry optic
10 Avalanche diode
11 Cooling component
12 Intermediate element
13 Further cooling component
14 Peltier element
15 Ribs
16 Electrically insulating material
17 Semiconductor elements

What is claimed is:

1. A detector apparatus configured to receive light and generate electrical signals, the detector apparatus comprising:
    a light sensor having a light incidence side, the light sensor including at least one photocathode;
    a cooling component, the cooling component being in direct contact, on the light incidence side, with at least one of the light sensor and a substrate carrying the light sensor; and
    an accelerator apparatus configured to accelerate electrons generated by the photocathode toward an avalanche diode.

2. The detector apparatus recited in claim 1, wherein at least one of:
    the detector apparatus includes a housing; and
    the light sensor and cooling component are disposed in the housing.

3. The detector apparatus recited in claim 1, wherein light to be detected defines a light path passing through the cooling component.

4. The detector apparatus recited in claim 1, wherein the cooling component is a thermally conductive, electrically insulating intermediate element.

5. The detector apparatus recited in claim 1, further comprising a further cooling component that is at least one of:
    disposed inside a housing; and
    in thermally conductive contact with the cooling component.

6. The detector apparatus recited in claim 5, wherein at least one of:
    a. a light path, extending through the further cooling component, is defined for the light to be detected;
    b. the further cooling component includes a thermally conductive, electrically insulating intermediate element; and
    c. the further cooling component is in direct contact with at least one of a photocathode, or a substrate carrying the photocathode.

7. The detector apparatus recited in claim 5, wherein at least one of the cooling component and the further cooling component includes an active cooling component which is a Peltier element, a heat pump or a heat pipe.

8. The detector apparatus recited in claim 5, wherein at least one of the cooling component and the further cooling component is disposed so as to heat at least one of:
    an entry window of the housing; and
    an entry optic of the housing.

9. The detector apparatus recited in claim 5, wherein at least one of the cooling component and the further cooling component includes a passive cooling component through which a heat flow takes place.

10. The detector apparatus recited in claim 9, wherein at least one of the cooling component and the further cooling component includes at least one electrically insulating and thermally conductive material which includes a least one of boron nitride, aluminum nitride, aluminum oxide, diamond, synthetic diamond and a combination thereof.

11. The detector apparatus recited in claim 9, wherein at least one of:
    a. at least one of the cooling component and the further cooling component is both an electrical insulator and a thermal conductor;
    b. at least one of the cooling component and the further cooling component includes a composite material;
    c. at least one of the cooling component and the further cooling component comprises a core made of aluminum, that is surrounded at least partly by an electrical insulator film; and
    d. at least one of the cooling component and the further cooling component includes a core made of aluminum, that is at least partially surrounded by an electrical insulator that is thinner, with respect to the thermal conduction direction, than the core.

12. The detector apparatus recited in claim 5, wherein at least one of the cooling component and the further cooling component has a thermal conductivity greater than 500 W/mK.

13. The detector apparatus recited in claim 5, wherein at least one of the cooling component and the further cooling component has an electrical conductivity of less than $10^{-8}$ S/m.

14. The detector apparatus recited in claim 5, wherein at least one of the cooling component and the further cooling component includes a leakage path that is lengthened so as to increase leakage current resistance on an outer surface by means of at least one of:
- a labyrinth;
- ribs;
- at least one groove; and
- at least one projection.

15. The detector apparatus recited in claim 5, wherein at least one of the cooling component and the further cooling component is substantially annular or cylindrical.

16. The detector apparatus recited in claim 5, wherein at least one of:
   a. interstices of at least one of the cooling component and the further cooling component are filled with an electrically insulating material;
   b. interstices of at least one of the cooling component and the further cooling component are filled with an electrically and thermally insulating material;
   c. at least one of the cooling component and the further cooling component includes a thermoelectric converter, configured as a Peltier element, whose interstices are filled with an electrically insulating material;
   d. at least one of the cooling component and the further cooling component includes a thermoelectric converter, configured as a Peltier element, whose interstices are filled with an electrically and thermally insulating material; and
   e. at least one of the cooling component and the thither cooling component are embodied as a thermoelectric converter, configured as a Peltier element, having interstices filled with epoxy resin or silicone.

17. The detector apparatus recited in claim 5, wherein the cooling component and the further cooling component are connected thermally in series.

18. The detector apparatus recited in claim 2, wherein at least one of:
- the housing is gas-tight; and
- a vacuum exists in the housing.

19. The detector apparatus recited in claim 2, wherein at least one of:
   a. an electrical potential difference exists between the detector and the housing; and
   b. an electrical potential difference of more than 8000 V exists between the detector and the housing.

20. The detector apparatus recited in claim 1, wherein the detector apparatus contains a detector, comprising the light sensor, that is operated with a voltage of more than 8000 V.

21. The detector apparatus recited in claim 2, wherein the light sensor and the housing are thermally conductively connected by at least one of the cooling component and the further cooling component, the contact area of at least one of the cooling component and the further cooling component with the light sensor being smaller than the contact area of at least one of the cooling component and/or of the further cooling component with the housing.

22. The detector apparatus recited in claim 2, wherein the cooling component is a passive cooling component that conducts heat from at least one of the light sensor and the substrate of the light sensor to a further active cooling component that is not in direct contact with the light sensor nor with a substrate of the light sensor, and wherein the further active cooling component emits heat to the housing.

23. An optical apparatus including a detector apparatus configured to receive light and generate electrical signals, the detector apparatus comprising:
- a light sensor having a light incidence side, the light sensor including at least one photocathode;
- a cooling component, the cooling component being in direct contact, on the light incidence side, with at least one of the light sensor and a substrate carrying the light sensor; and
- an accelerator apparatus configured to accelerate electrons generated by the photocathode toward an avalanche diode.

24. The optical apparatus recited in claim 23, wherein the optical apparatus is a microscope, a scanning microscope or a confocal scanning microscope.

* * * * *